US012785692B2

(12) United States Patent
Maheshwari et al.

(10) Patent No.: US 12,785,692 B2
(45) Date of Patent: Nov. 3, 2026

(54) BACKSIDE METALLIZATION FOR FPGA RESOURCES

(71) Applicant: Altera Corporation, San Jose, CA (US)

(72) Inventors: Atul Maheshwari, Portland, OR (US); Mahesh K. Kumashikar, Bangalore (IN); Ankireddy Nalamalpu, Portland, OR (US); MD Altaf Hossain, Portland, OR (US); Mahesh A. Iyer, Fremont, CA (US)

(73) Assignee: Altera Corporation, San Jose, CA (US)

( * ) Notice: Subject to any disclaimer, the term of this patent is extended or adjusted under 35 U.S.C. 154(b) by 149 days.

(21) Appl. No.: 17/957,210

(22) Filed: Sep. 30, 2022

(65) Prior Publication Data

US 2023/0024515 A1 Jan. 26, 2023

(51) Int. Cl.
*H03K 19/17736* (2020.01)
*H10W 20/43* (2026.01)

(52) U.S. Cl.
CPC ........ *H03K 19/1774* (2013.01); *H10W 20/43* (2026.01)

(58) Field of Classification Search
CPC ........... H03K 19/177; H03K 19/17736; H03K 19/17724; H03K 19/1774; H01L 23/52; H01L 23/5222; H01L 23/528; H10W 20/43
See application file for complete search history.

(56) References Cited

U.S. PATENT DOCUMENTS

| | | | | |
|---|---|---|---|---|
| 10,833,679 | B2 * | 11/2020 | Clark | G11C 5/025 |
| 2013/0320560 | A1 * | 12/2013 | Secker | H03K 5/1252 257/774 |
| 2016/0049941 | A1 | 2/2016 | How et al. | |
| 2018/0331072 | A1 * | 11/2018 | Nequist | H10D 84/038 |
| 2019/0042251 | A1 * | 2/2019 | Nurvitadhi | G05B 19/056 |
| 2019/0044515 | A1 * | 2/2019 | Gutala | G11C 7/10 |
| 2019/0050361 | A1 * | 2/2019 | Raghava | G06F 13/4282 |
| 2019/0103872 | A1 * | 4/2019 | Clark | H03K 19/1776 |
| 2019/0230049 | A1 * | 7/2019 | Clark | H04L 49/109 |
| 2020/0279793 | A1 * | 9/2020 | Xie | H10W 20/20 |
| 2020/0395942 | A1 * | 12/2020 | Wallichs | H03K 19/17736 |
| 2021/0058085 | A1 * | 2/2021 | Clark | G11C 5/025 |
| 2021/0303491 | A1 * | 9/2021 | Ooi | G06F 13/20 |
| 2021/0313988 | A1 * | 10/2021 | Weber | H03K 19/1774 |
| 2022/0013488 | A1 * | 1/2022 | Kumashikar | G06F 30/39 |
| 2023/0024515 | A1 * | 1/2023 | Maheshwari | H03K 19/1774 |
| 2023/0244485 | A1 * | 8/2023 | Nurvitadhi | G06F 9/3004 712/222 |
| 2024/0348253 | A1 * | 10/2024 | Maheshwari | H03K 19/17728 |
| 2025/0219964 | A1 * | 7/2025 | Clark | H04L 49/109 |
| 2025/0309114 | A1 * | 10/2025 | Abou-Alfotouh | H10W 20/42 |

* cited by examiner

*Primary Examiner* — Jason M Crawford
(74) *Attorney, Agent, or Firm* — Fletcher Yoder, PC

(57) ABSTRACT

A programmable logic device may include a first layer formed using backside metallization on a back plane of the programmable logic device and a second fabric routing circuitry to route second data within the programmable fabric. The first layer may include first fabric routing circuitry to route first data within a programmable fabric of the programmable logic device, and clock routing circuitry to route clock signals within the programmable fabric.

20 Claims, 8 Drawing Sheets

BACKSIDE METALLIZATION FOR FPGA RESOURCES

BACKGROUND

The present disclosure relates generally to programmable logic devices. More particularly, the present disclosure relates to using backside metallization to achieve high-capacity integrated circuits such as high-capacity field programmable gate arrays (FPGAs).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuits devices are found in numerous electronic devices, from handheld devices, computers, gaming systems, robotic devices, automobiles, and more. As integrated circuit devices become increasingly complex, one or more components may be added to improve or implement operations of the device. For example, one or more clocks may be utilized to drive signal transfers within the device. In another example, additional communication wires may be added to the device and used to transfer signals within the device. However, supporting multiple clocks and communication wires may contribute to significant power consumption. Furthermore, clock signals from the clocks may experience skew and/or jitter when propagating along the communication wires.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
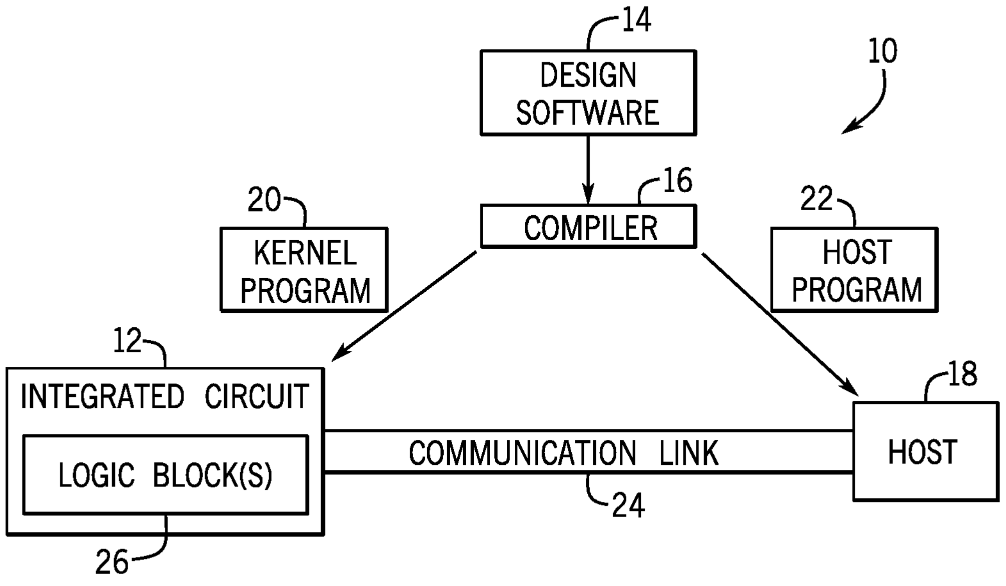
FIG. 1 is a block diagram of a system used to program an integrated circuit device, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present disclosure describes systems and techniques related to using backside metallization to achieve high-capacity integrated circuits, such as high-capacity field programmable gate arrays (FPGAs). In particular, the embodiments described herein are directed to disposing one or more signal metals within a first layer (e.g., front side) of the integrated circuit device and one or more components to a second layer (e.g., backside) of the integrated circuit device. In this way, the first layer may prioritize signal transfers, and the second layer may perform one or more other operations of the integrated circuit device. For example, the second layer may be coupled to one or more bumps and include clock routing circuitry, power delivery circuitry, and/or fabric routing circuitry. The clock routing circuitry may include one or more clocks that generate or use a clock signal for operation of the integrated circuit device. The power delivery circuitry may distribute power received from the bumps within the integrated circuit device. The bumps may include and/or utilize input/output circuitry and power delivery circuitry. In this way, the second layer may provide clock signals and/or power to the integrated circuit device while the first layer is dedicated to signal transfer.

By disposing the clock routing circuitry and the power delivery circuitry within the second layer, a distance between the clock routing circuitry and a power supply may be decreased. In this way, one or more clocks may operate with a lower skew and fewer repeaters (e.g., lower jitter), thereby allowing the clocks to operate at higher frequencies. Furthermore, the clocks may operate at a lower voltage in comparison to a programmable fabric of the integrated circuit device. In this way, power delivery may be separated between the clocks and the programmable fabric. By operating at lower voltages, the clocks may experience lower (e.g., slower) aging degradation, thereby improving life expectancy of the integrated circuit device.

Moreover, separating the integrated circuit device into the first layer and the second layer may decrease manufacturing costs by simplifying a fabrication (e.g., manufacturing) process. For example, the integrated circuit device may include a first layer (e.g., front side) fabricated by a first set of masks and/or a first process and a second layer (e.g., backside) fabricated by a second set of masks and/or a second process. The first layer may be consistent (e.g., standardized) between one or more embodiments of integrated circuit devices. The first layer (e.g., front side) may include one or more signal metals dedicated to signal transfer and an amount and/or a pattern of the signal metals may be consistent (e.g., standardized) between one or more embodiments of integrated circuit devices. In other words, one or more embodiments of the integrated circuit devices may have a same first layer, thereby reducing fabrication costs and complexity. As described herein, the second layer may include one or more components for implementing one or more functionalities of the integrated circuit device. To this end, a second set of masks and/or a second set of processes may be used to form the one or more components disposed within the second layer. Indeed, a manufacturer may select the second set of masks and/or a second set of processes based on the functionalities of the integrated circuit device. For example, in high performance integrated circuit device, additional clocks and power delivery circuitry may be desired in comparison to a high density integrated circuit device. As such, the manufacturer may select a second set of masks and/or a second set of processes to form the additional clocks and power delivery circuitry in the second layer. In other words, the second set of masks and/or the second set of processes may change based on the functionality of the integrated circuit device. Accordingly, the manufacturer may reduce fabrication costs and complexity by standardizing the first layer and forming the second layer based on the specific functionality of the specific integrated circuit device. In this way, modular integrated circuit devices, such as high-capacity, high-performance, and/or updated versions field programmable gate arrays (FPGAs) or application specific integrated circuits (ASICs)) may be achieved with a single signal delivery layer implementation.

With the foregoing in mind, FIG. 1 illustrates a block diagram of a system 10 that may implement one or more functionalities. For example, a designer may desire to implement functionality, such as the operations of this disclosure, on an integrated circuit device 12 (e.g., a programmable logic device, such as a field programmable gate array (FPGA) or an application specific integrated circuit (ASIC)). In some cases, the designer may specify a high-level program to be implemented, such as an OPENCL® program, which may enable the designer to more efficiently and easily provide programming instructions to configure a set of programmable logic cells for the integrated circuit device 12 without specific knowledge of low-level hardware description languages (e.g., Verilog or VHDL). For example, since OPENCL® is quite similar to other high-level programming languages, such as C++, designers of programmable logic familiar with such programming languages may have a reduced learning curve than designers that are required to learn unfamiliar low-level hardware description languages to implement new functionalities in the integrated circuit device 12.

The designer may implement high-level designs using design software 14, such as a version of INTEL® QUARTUS® by INTEL CORPORATION. The design software 14 may use a compiler 16 to convert the high-level program into a lower-level description. In some embodiments, the compiler 16 and the design software 14 may be packaged into a single software application. The compiler 16 may provide machine-readable instructions representative of the high-level program to a host 18 and the integrated circuit device 12. The host 18 may receive a host program 22 which may be implemented by the kernel programs 20. To implement the host program 22, the host 18 may communicate instructions from the host program 22 to the integrated circuit device 12 via a communications link 24, which may be, for example, direct memory access (DMA) communications or peripheral component interconnect express (PCIe) communications. In some embodiments, the kernel programs 20 and the host 18 may enable configuration of a logic block 26 on the integrated circuit device 12. The logic block 26 may include circuitry and/or other logic elements and may be configured to implement arithmetic operations, such as addition and multiplication.

The designer may use the design software 14 to generate and/or to specify a low-level program, such as the low-level hardware description languages described above. For example, the design software 14 may be used to map a workload to one or more routing resources of the integrated circuit device 12 based on a timing, a wire usage, a logic utilization, and/or a routability. In another example, the design software 14 may be used to route first data to a portion of the integrated circuit device 12 and route second data, power, and clock signals to a second portion of the integrated circuit device 12. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Figure 2:
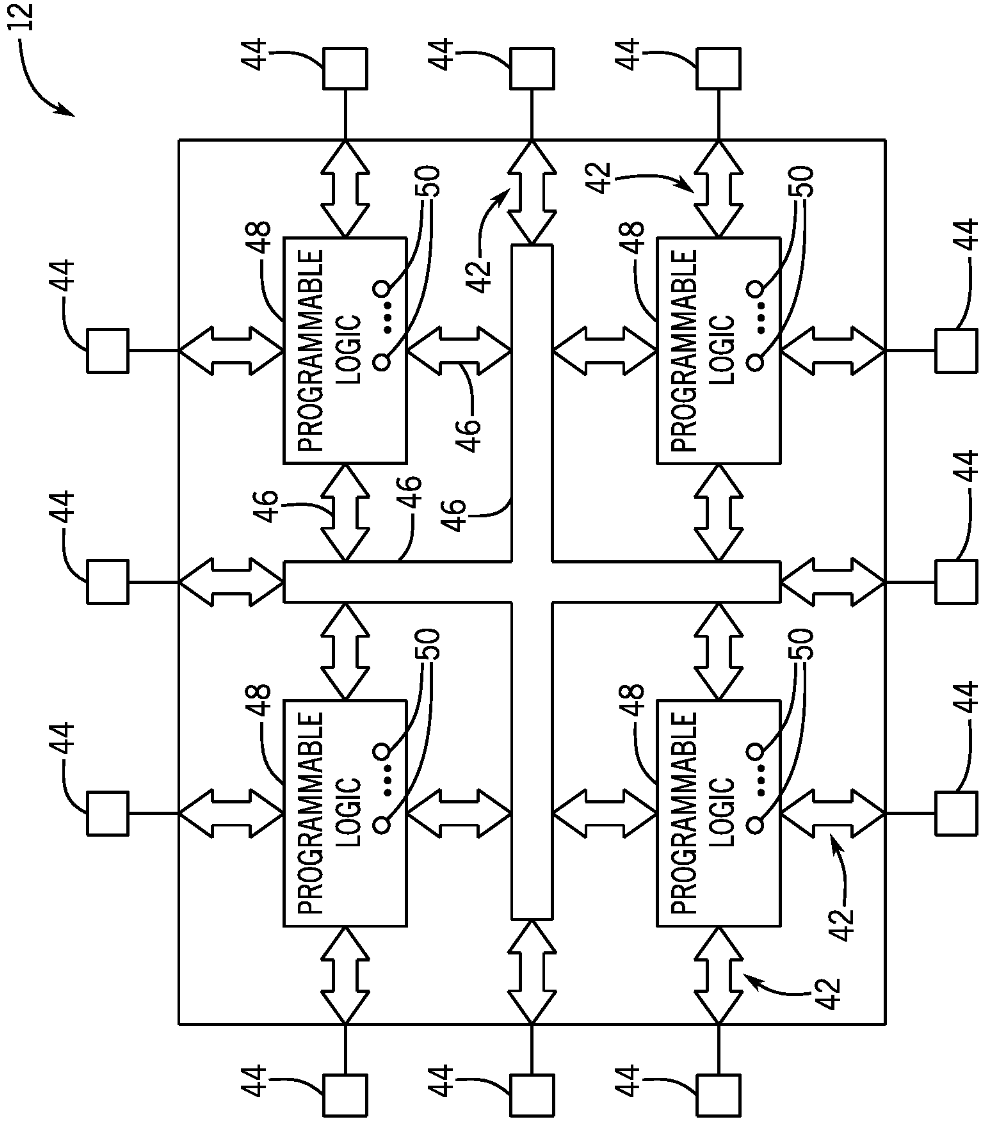
FIG. 2 is a block diagram of the integrated circuit device of FIG. 1, in accordance with an embodiment of the present disclosure.

Turning now to a more detailed discussion of the integrated circuit device 12, FIG. 2 is a block diagram of an example of the integrated circuit device 12 as a programmable logic device, such as a field-programmable gate array (FPGA). Further, it should be understood that the integrated circuit device 12 may be any other suitable type of programmable logic device (e.g., a structured ASIC such as eASIC™ by Intel Corporation ASIC and/or application-specific standard product). The integrated circuit device 12 may have input/output circuitry 42 for driving signals off device and for receiving signals from other devices via input/output pins 44. Interconnection resources 46, such as global and local vertical and horizontal conductive lines and buses, and/or configuration resources (e.g., hardwired couplings, logical couplings not implemented by user logic), may be used to route signals on integrated circuit device 12. Additionally, interconnection resources 46 may include fixed interconnects (conductive lines) and programmable interconnects (i.e., programmable connections between respective fixed interconnects). For example, the interconnection resources 46 may be used to route signals, such as clock or data signals, through the integrated circuit device 12. Additionally or alternatively, the interconnection resources 46 may be used to route power (e.g., voltage) through the integrated circuit device 12. Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as the integrated circuit device 12, may include programmable elements 50 with the programmable logic 48. In some embodiments, at least some of the programmable elements 50 may be grouped into logic array blocks (LABs). As discussed above, a designer (e.g., a customer) may (re)program (e.g., (re)configure) the programmable logic 48 to perform one or more desired functions. By way of example, some programmable logic devices may be programmed or reprogrammed by configuring programmable elements 50 using mask programming arrangements, which is performed during semiconductor manufacturing. Other programmable logic devices are configured after semiconductor fabrication operations have been completed, such as by using electrical programming or laser programming to program programmable elements 50. In general, programmable elements 50 may be based on any suitable programmable technology, such as fuses, antifuses, electrically programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using input/output pins 44 and input/output circuitry 42. In one embodiment, the memory cells may be implemented as random-access-memory (RAM) cells. The use of memory cells based on RAM technology as described herein is intended to be only one example. Further, since these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Figure 3:
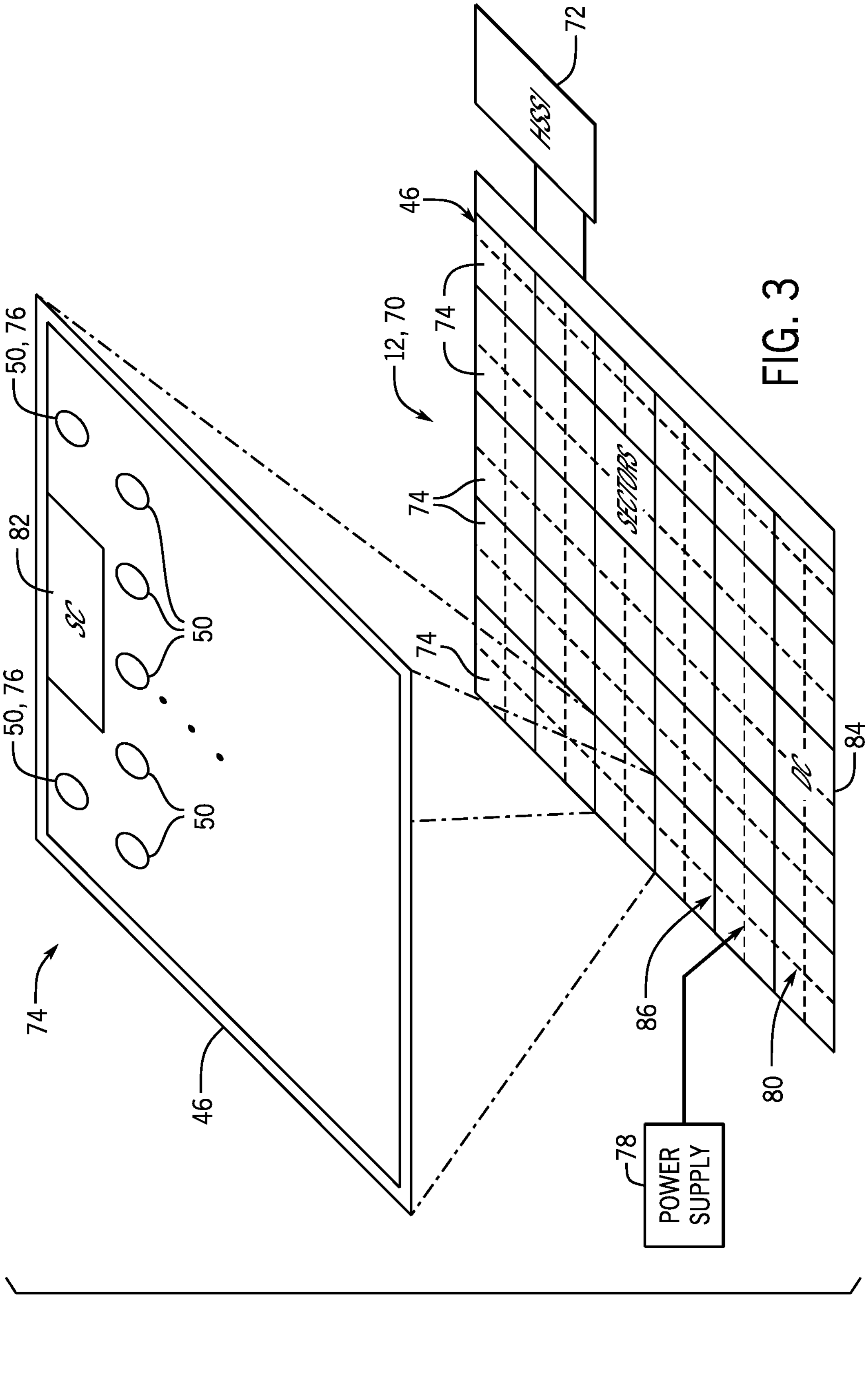
FIG. 3 is a block diagram of programmable fabric of the integrated circuit device of FIG. 1, in accordance with an embodiment of the present disclosure.

The integrated circuit device 12 may include any programmable logic device such as a field programmable gate array (FPGA) 70, as shown in FIG. 3. For the purposes of this example, the FPGA 70 is referred to as a FPGA, though it should be understood that the device may be any suitable type of programmable logic device (e.g., an application-specific integrated circuit and/or application-specific standard product). In one example, the FPGA 70 is a sectorized FPGA of the type described in U.S. Patent Publication No. 2016/0049941, "Programmable Circuit Having Multiple Sectors," which is incorporated by reference in its entirety for all purposes. The FPGA 70 may be formed on a single plane. Additionally or alternatively, the FPGA 70 may be a three-dimensional FPGA having a base die and a fabric die of the type described in U.S. Pat. No. 10,833,679, "Multi-Purpose Interface for Configuration Data and User Fabric Data," which is incorporated by reference in its entirety for all purposes.

In the example of FIG. 3, the FPGA 70 may include transceiver 72 that may include and/or use input/output circuitry, such as input/output circuitry 42 in FIG. 2, for driving signals off the FPGA 70 and for receiving signals from other devices. Interconnection resources 46 may be used to route signals, such as clock or data signals, through the FPGA 70. The FPGA 70 is sectorized, meaning that programmable logic resources may be distributed through a number of discrete programmable logic sectors 74. Programmable logic sectors 74 may include a number of programmable logic elements 50 having operations defined by configuration memory 76 (e.g., CRAM). A power supply 78 may provide a source of voltage (e.g., supply voltage) and current to a power distribution network (PDN) 80 that distributes electrical power to the various components of the FPGA 70. Operating the circuitry of the FPGA 70 causes power to be drawn from the power distribution network 80.

There may be any suitable number of programmable logic sectors 74 on the FPGA 70. Indeed, while 29 programmable logic sectors 74 are shown here, it should be appreciated that more or fewer may appear in an actual implementation (e.g., in some cases, on the order of 50, 100, 500, 1000, 5000, 10,000, 50,000 or 100,000 sectors or more). Programmable logic sectors 74 may include a sector controller (SC) 82 that controls operation of the programmable logic sector 74. Sector controllers 82 may be in communication with a device controller (DC) 84.

Sector controllers 82 may accept commands and data from the device controller 84 and may read data from and write data into its configuration memory 76 based on control signals from the device controller 84. In addition to these operations, the sector controller 82 may be augmented with numerous additional capabilities. For example, such capabilities may include locally sequencing reads and writes to implement error detection and correction on the configuration memory 76 and sequencing test control signals to effect various test modes.

The sector controllers 82 and the device controller 84 may be implemented as state machines and/or processors. For example, operations of the sector controllers 82 or the device controller 84 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow routines to have multiple variants depending on "modes" the local controller may be placed into. When the control program memory is implemented as RAM, the RAM may be written with new routines to implement new operations and functionality into the programmable logic sectors 74. This may provide usable extensibility in an efficient and easily understood way. This may be useful because new commands could bring about large amounts of local activity within the sector at the expense of only a small amount of communication between the device controller 84 and the sector controllers 82.

Sector controllers 82 thus may communicate with the device controller 84, which may coordinate the operations of the sector controllers 82 and convey commands initiated from outside the FPGA 70. To support this communication, the interconnection resources 46 may act as a network between the device controller 84 and sector controllers 82. The interconnection resources 46 may support a wide variety of signals between the device controller 84 and sector controllers 82. In one example, these signals may be transmitted as communication packets.

The use of configuration memory 76 based on RAM technology as described herein is intended to be only one example. Moreover, configuration memory 76 may be distributed (e.g., as RAM cells) throughout the various programmable logic sectors 74 of the FPGA 70. The configuration memory 76 may provide a corresponding static control output signal that controls the state of an associated programmable logic element 50 or programmable component of the interconnection resources 46. The output signals of the configuration memory 76 may be applied to the gates of metal-oxide-semiconductor (MOS) transistors that control the states of the programmable logic elements 50 or programmable components of the interconnection resources 46.

The programmable elements 50 of the FPGA 40 may also include some signal metals (e.g., communication wires) to transfer a signal. In an embodiment, the programmable logic sectors 74 may be provided in the form of vertical routing channels (e.g., interconnects formed along a y-axis of the FPGA 70) and horizontal routing channels (e.g., interconnects formed along an x-axis of the FPGA 70), and each routing channel may include at least one track to route at least one communication wire. If desired, communication wires may be shorter than the entire length of the routing channel. That is, the communication wire may be shorter than the first die area or the second die area. A length L wire may span L routing channels. As such, length four wires in a horizontal routing channel may be referred to as "H4" wires, whereas length four wires in a vertical routing channel may be referred to as "V4" wires.

As discussed above, some embodiments of the programmable logic fabric may be configured using indirect configuration techniques. For example, an external host device may communicate configuration data packets to configuration management hardware of the FPGA 70. The data packets may be communicated internally using data paths and specific firmware, which are generally customized for communicating the configuration data packets and may be based on particular host device drivers (e.g., for compatibility). Customization may further be associated with specific device tape outs, often resulting in high costs for the specific tape outs and/or reduced salability of the FPGA 70.

Figure 4:
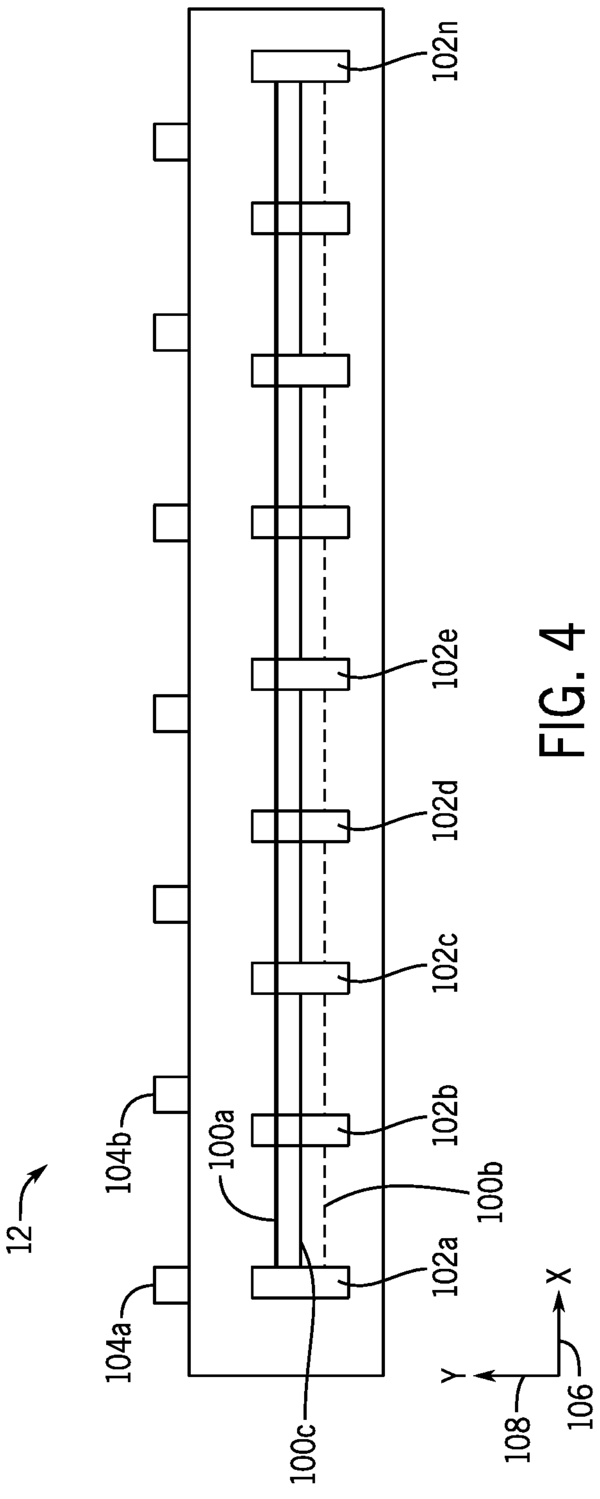
FIG. 4 is a block diagram of the programmable fabric of the integrated circuit device of FIG. 1, in accordance with an embodiment of the present disclosure.

With the foregoing in mind, FIG. 4 is a block diagram of the integrated circuit device 12 being a die that may be used to implement the FPGA 70. As shown, the integrated circuit device 12 generally includes one or more communication wires 100, fabric routing circuitry 102, and one or more bumps 104. The communication wires 100 may include fabric wires for routing clock signals, data signals, and power (e.g., voltage, current) within the integrated circuit device 12.

Although, the communication wires 100 are referred to as "wires," as used herein, the wires may include any suitable interconnection resources, such as trace lines/metal interconnect layers, through-silicon-vias (TSVs), busses, and/or other interconnection resources, such as the interconnection resources 46 including global and local vertical and horizontal conductive lines and buses and/or configuration resources (e.g., hardwired couplings, logical couplings) used to route clock signals and data signals within the integrated circuit device 12. As such, the communication wires 100 may also include one or more signal metals for transferring a signal (e.g., data, communication packets). The communication wires 100 may be any suitable class (e.g., length), such as H4, H6, H12, V4, V6, V12, and so on. In certain instances, a longer communication wire may have less capacitance or less resistance in comparison to using shorter communication wires/segments with multiple junctions to cross the same distance. As further described herein, a longer communication wire may propagate a signal faster than the multiple shorter communication wires/segments with multiple junctions, by having lower latency and improved throughput.

In certain instances, the communication wires 100 may be disposed within the integrated circuit device 12 based on a class. For example, the integrated circuit device 12 may include a first communication wire 100*a*, a second communication wire 100*b*, and a third communication wire 100*c* (collectively referred to as communication wires 100). In certain instances, the first communication wire 100*a* may be a fabric wire for propagating one or more clock signals and/or for power delivery. However, the first communication wire 100*a* may also transfer signals within the integrated circuit device 12. The second communication wire 100*b* and third communication wire 100*c* may include one or more signal metals for transferring signals within the integrated circuit device 12.

As illustrated, the communication wires 100 may include multiple segments that, in total, span across the integrated circuit device 12 in a horizontal direction 106 and couple to one or more routing circuitries 102. The second communication wire 100*b* may have a length equivalent to a distance between a first routing circuitry 102*a* and a second routing circuitry 102*b*. The second communication wire 100*b* may also include one or more communication segments of wires between the second routing circuitry 102*b* and the third routing circuitry 102*c*, between the third routing circuitry 102*c* and the fourth routing circuitry 102*d*, the fourth routing circuitry 102*d* and the fifth routing circuitry 102*e*, and so on. In this way, a signal may propagate through one or more routing circuitries 102 of the integrated circuit device 12.

Additionally or alternatively, the integrated circuit device 12 may include the third communication wires 100*c* which may be adjacent to the second communication wires 100*b* in a vertical direction 108. In certain instances, a metal layer may continue in the vertical direction 108. For example, the third communication wire 100*c* may be disposed in a metal 3 (M3) layer which may be adjacent to a metal 2 (M2) layer containing the second communication wire 100*b*. Furthermore, the first communication wire 100*a* may be disposed within a metal 13 (M13) layer which may be above the second communication wire 100*b* and the third communication wire 100*c* in the vertical direction 108. It may be understood that numbering of the metal layers may increase in the vertical direction 108. For example, a metal 1 (M1) layer may be a first metal layer deposited above the wafer in the vertical direction 108, followed by a M2 layer, a M3 layer, a metal 3 (M4) layer, and so on. Each of the metal layers may be communicatively coupled by the fabric routing circuitry 102. Indeed, the integrated circuit device 12 may include any suitable number of metal layers and the communication wires 100*a-c* may be deposited in any suitable metal layer, such as M1, M3, M5, M7, M9, M13, and so on.

As illustrated, the third communication wire 100*c* may be longer (e.g., double the length) of the second communication wire 100*b*. The third communication wire 100*c* may be coupled to the first routing circuitry 102*a* and the third routing circuitry 102*c*. The third communication wire 100*c* may also include communication wires coupled to the third routing circuitry 102*c* and the fifth routing circuitry 102*e*, and so on. In this way, signals propagating through the third communication wires 100*c* may be directly routed from the first routing circuitry 102*a* to the third routing circuitry 102*c*, thereby skipping the second routing circuitry 102*b*. As such, signals propagating through the third communication wires 100*c* may be faster than signals propagating through the second communication wires 100*b*. In certain embodiments, the communication wires 100 may have different lengths than those shown.

Further, the first communication wire 100*a* may have a length that extends between a number (e.g., five) of fabric routing circuitries 102. As illustrated, the first communication wire 100*a* may be coupled to the first routing circuitry 102*a* and the fifth fabric routing circuitry 102*e*. The first communication wire 100*a* may also be coupled to the fifth fabric routing circuitry 102*e* and a ninth fabric routing circuitry 102*n*. In this way, the first communication wires 100*a* may have less capacitance, less resistance, and higher throughput when communicating between routing circuitry

102*a* and 102*e* or 102*e* and 102*n* than the same connections using the second communication wires 100*b* and/or the third communication wires 100*c*.

For signal transfer between communication wires 100*a-c*, the signal may be propagated through the fabric routing circuitry 102. The fabric routing circuitry 102 may include fixed interconnects (conductive lines) and programmable interconnects (i.e., programmable connections between respective fixed interconnects). The fabric routing circuitry 102 may also include configuration resources such as hard-wired couplings and/or logical couplings not implemented by user logic to propagate signals between the metal layers. By way of example, signal transfer in the horizontal direction 106 may propagate through a class of communication wires 100 and one or more fabric routing circuitries 102. For example, the signal may propagate from the first fabric routing circuitry 102*a* to the communication wires 100*a-c* to a subsequent fabric routing circuitry 102. Additionally or alternatively, for signal transfers in the vertical direction 108 (e.g., between metal layers), the signal may propagate through the fabric routing circuitry 102. For example, a signal may propagate through the second communication wire 100*b* to the fabric routing circuitry 102 then propagate to the first communication wire 100*a*. In this way, signals may be transferred within the integrated circuit device 12.

While the illustrated example includes nine fabric routing circuitries 102, it should be appreciated that any suitable number of fabric routing circuitries 102 may be disposed within the integrated circuit device 12. Additionally, while three classes of communication wires 100 are shown here, it should be appreciated that communication wires of any suitable class and/or length may be utilized. Additionally or alternatively, more or fewer communication wires 100 may appear in actual implementation (e.g., in some cases on the order of 10, 50, 100, 1000, 5000, communication wires or more).

The integrated circuit device 12 may also include one or more bumps 104 coupled to a first side (e.g., front side) of the die. The bumps 104 may include and/or use the input/output circuitry 42 with respect to FIG. 2 for driving signals off the integrated circuit device 12 and for receiving signals from other devices. The bumps 104 may also include and/or use the power distribution network 80 described with respect to FIG. 2 to distribute power throughout the integrated circuit device 12. The bumps 104 may include microbumps, hybrid bumps, or larger bumps (e.g, controlled collapse chip connection (C4) bumps). For example, a first bump 104*a* may be configured to input/output data while a second bump 104*b* may be configured to receive power. Additionally or alternatively, the bumps 104 may be used for interfacing with other devices.

The integrated circuit device 12 may receive and implement a clock signal. To implement circuit designs in the integrated circuit device 12, different sectors, portions, or regions of the integrated circuit device 12 may perform different operations on signals (e.g., data) that may be exchanged between the regions. In order to process and exchange data, it may be useful to have synchronization in the timing of the operations taking place in the multiple sectors (e.g., regions). It may be beneficial to provide a synchronized clock signal to various circuit elements (e.g., registers, memory elements) from a clock (e.g., clock tree, clock circuitry). As such, the clock signal may be used to set an operating frequency of the integrated circuit device 12. Moreover, the integrated circuit device 12 may include clock resources (e.g., clock network, clock tree) that generate clock signals. In other embodiments, the clock generation may be external to the integrated circuit device 12 and the integrated circuit device 12 may receive the clock signal via the bumps 104 with internal resources used for routing the received clock signal.

In certain instances, unintentional signal transfers/noise between the communication wires 100 may result in capacitive coupling and data loss. For example, the first communication wire 100*a* may propagate a clock signal while the second communication wire 100*b* may transfer a data signal. A charge from the first communication wire 100*a* may be transferred to the second communication wire 100*b*, thereby altering the data signal. In another example, a charge from the power distribution network 80 may be unintentionally transferred to the second communication wire 100*b* and/or the third communication wire 100*c*. The charge may affect the signals being transferred by the second communication wire 100*b* and/or the third communication wire 100*c*, thereby disrupting signal transfer within the integrated circuit device 12.

In an instance, the first communication wire 100*a* may receive the clock signal and route the clock signal within the integrated circuit device 12 to implement one or more functionalities. However, propagating long distances may lead to undesired clock skews. Furthermore, due to a native resistance in the communication wires 100, the clock signal may experience deviation, referred to as a timing jitter. The timing jitter may also be caused by interference or capacitive coupling between the communication wires, resulting in data loss. Additionally or alternatively, manufacturing imperfections, environmental factors, or any other real world considerations may affect the clock resources and/or the clock signal, thereby causing/increasing clock skew or clock jitter. The skew and jitter of the clock signal may cause the operating frequency of the integrated circuit device 12 to decrease, thereby affecting the functionality of the integrated circuit device 12. Furthermore, operation of the clock resources and/or transmitting the clock signals causes significant power to be drawn which may decrease power efficiency of the integrated circuit device 12.

As described herein, the integrated circuit device 12 may be fabricated with one or more masks. The fabrication process may begin with a blank wafer, such as a silicon wafer, silicon carbide wafer, a glass wafer, a sapphire wafer, or the like. The wafer may be patterned with one or more masks and/or one or more processes to create a first side (e.g., layer) of the integrated circuit device 12, referred to as the front side. For example, the wafer may be patterned to form one or more transistors, one or more communication wires 100, the fabric routing circuitry 102, or the like. Then, one or more metal layers may be deposited top of the wafer. For example, a metal 1 (M1) layer may be deposited followed by a metal 2 (M2) layer followed by a metal 3 (M3) layer, and so on. The deposited metal layers may contain also one or more communication wires 100. One or more vias may be used to connect the "wires" in the metal layers for signal transfers. As the number of metal layers increase in the vertical direction 108, an amount of resistance for signal transfer to the desired metal layer may also increase due to space constraints. For example, the M1 layer may be the first metal layer deposited above the silicon wafer in the vertical direction 108; as such, a via depth from the M1 layer to the silicon wafer may be small and the resistance may be minimal. However, the M5 layer may be five metal layers above the silicon wafer in the vertical direction 106. As such, a via to the M5 layer may have a longer via depth in comparison to vias on the M1 layer, thereby increasing resistance of the overall path traveled by signals to/from the M5 layer through the via.

In certain instances, a manufacturer may design and fabricate integrated circuit devices 12 with different configurations to implement different functionalities. To achieve the different configurations, the manufacturer may utilize one or more processes to pattern the wafer with different masks which may be both time-consuming and expensive. For example, the manufacturer may pattern a first wafer with a first set of masks and/or a first set of processes to create a first version of the integrated circuit device 12 and pattern a second wafer with a second set of masks and/or a second set of processes to create a second version of the integrated circuit device 12. In certain instances, one or more masks of the first set may be similar or the same as one or more masks of the second set, but design and implementation of the different manufacturing techniques between the two versions may be significant. As such, it may be beneficial to reduce a number of masks and/or reuse a number of the masks, reduce complexity in manufacturing designs, reuse one or more manufacturing processes when possible while manufacturing the two different versions of the integrated circuit device 12.

Figure 5:
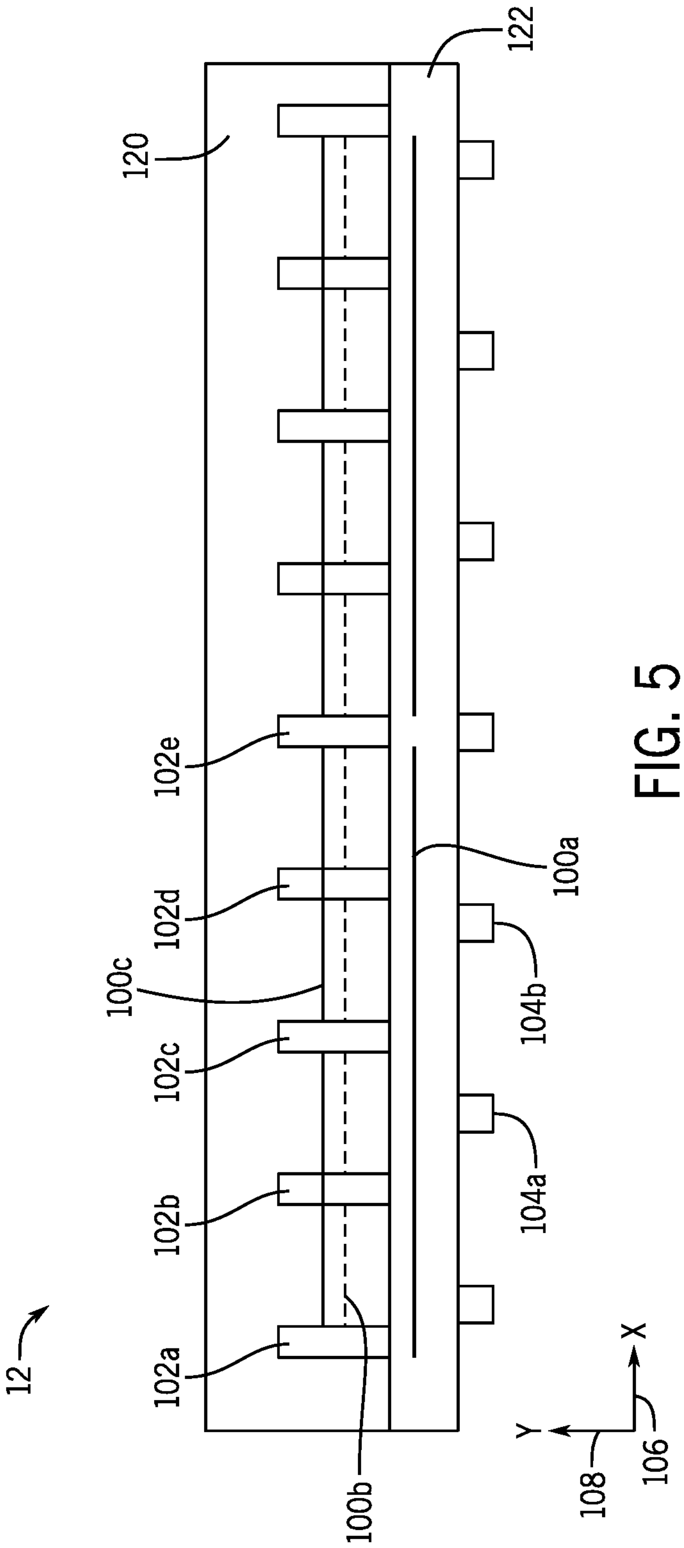
FIG. 5 is a block diagram of the programmable fabric of the integrated circuit device of FIG. 1, in accordance with an embodiment of the present disclosure.

With the foregoing in mind, FIG. 5 is a block diagram of the integrated circuit device 12 formed using backside metallization. In particular, the integrated circuit device 12 may include a first layer 120 (e.g., first set of layers, front side) including one or more signal metals for signal transfer and a second layer 122 (e.g., second set of layers, backside) including one or more components implementing a functionality of the integrated circuit device. The first layer 120 and/or the second layer may be used to implement an ASIC, a FPGA, such as the FPGA 70, or other programmable logic device to implement a programmable fabric. As used herein, the term "front side" may refer to a front side surface where a conventional integrated circuit device 12 may be fabricated, such as a side adjacent to or away from a carrier wafer, and the term "backside" may be an opposite surface of the substrate. Furthermore, the block diagram may be a simplified illustration omitting one or more components for the simplicity in discussing the first and second layers. For example, as further described with respect to FIG. 7, a transistor layer may be formed between the first layer 120 and the second layer 122.

As illustrated, the front side 120 may include the second communication wires 100*b*, the third communication wires 100*c*, and fabric routing circuitry 102. The front side 120 may be dedicated to transferring signals within the integrated circuit device 12. For example, the second communication wire 100*b* may receive a signal and transfer the signal to the second routing circuitry 102*b* for the third communication wire 100*c*. In another example, the third communication wire 100*c* may receive a signal from the third routing circuitry 102*c* and transfer the signal to the fifth routing circuitry 102*e*. In this way, the front side 120 may be dedicated to transferring signals within the integrated circuit device. While the second communication wire 100*b* and the third communication wire 100*c* are illustrated, it may be understood that there may be any suitable number of communication wires 100 within the front side 120. In certain instances, more or less communication wires may be added to the front side 120 depending on the application of the integrated circuit 12. For example, a higher density of communication wires 100 may be present in the front side 120 for high performance or high throughput.

The routing fabric circuitry 102 of the front side 120 may be coupled to the backside 122 to receive power and/or one or more signals. As illustrated, the backside 122 of the integrated circuit device 12 may include the first communication wires 100*a* and the bumps 104. As described herein, the bumps 104 may include and/or use the input/output circuitry 42 and the power distribution network 80 described with respect to FIG. 2. Signals received from the bumps 104 may be directly transferred through the backside 122 to the fabric routing circuitry 102 and through the front side 120.

Furthermore, the backside 122 may include the first communication wires 100*a*. As described herein, the first communication wires 100*a* may be longer than the second communication wires 100*b* and the third communication wires 100*c*. Placing the first communication wires 100*a* with the backside 122 may decrease the via depth, thereby reducing resistance when propagating signals along the first communication wires 100*a*.

Other functionality may be moved to the backside 122 in the die of the integrated circuit 12 of FIG. 5. For example, the backside 122 may include clock resources (e.g., clock network, clock tree, clock routing circuitry), power resources (e.g., power delivery network 80), or the like. In this way, the backside 122 may implement one or more functionalities of the integrated circuit device 12. For example, the backside 122 may include clock resources such as one or more clocks that generate and/or route a clock signal for the integrated circuit device 12. Placing both the clocking resources and the first communication wires 100*a* on the backside 122 may allow the clock signal routing to be improved. For example, the first communication wires 100*a* may receive the clock signal from the bumps 104 and directly route the clocking signal throughout the integrated circuit device 12. As such, a distance traveled by the clock signal may be reduced in comparison to the clock signal described with respect to FIG. 4 where there may be a competition for routing resources thereby potentially increasing routing paths of the clock signal. Indeed, decreasing the distance travelled by the clock signal may reduce or eliminate clock signal skew and jitter. As such, the integrated circuit device 12 may operate at a higher frequency with skew and jitter.

Furthermore, placing the clock resources close to the bumps 104 may reduce a distance between the clock resources and a power source, a distance between the two may be decreased, thereby reducing an amount of power consumed by the clock resources. That is, the clocking resources may operate at a lower voltage, thereby lowering aging degradation and improving life span. In some embodiments, some clocks (e.g., higher frequency clocks) may be moved to the backside 122 while some clocks (e.g., slower clocks) or data remain in the front side 120. Additionally or alternatively, the backside 122 may be used for power delivery. Moreover, when the clocking resources (especially for high frequency clocks) and power delivery are located in the backside 122, different clocks may operate more easily at different voltages than each other or than the data signals use in the front side 120. Accordingly, more of the clocks may operate at the minimum voltage and may decrease an amount of power dissipated during operation. For instance, this reduction may account for a 5-10% reduction in the core fabric and a dynamic reduction of up to 10-20%.

Figure 6:
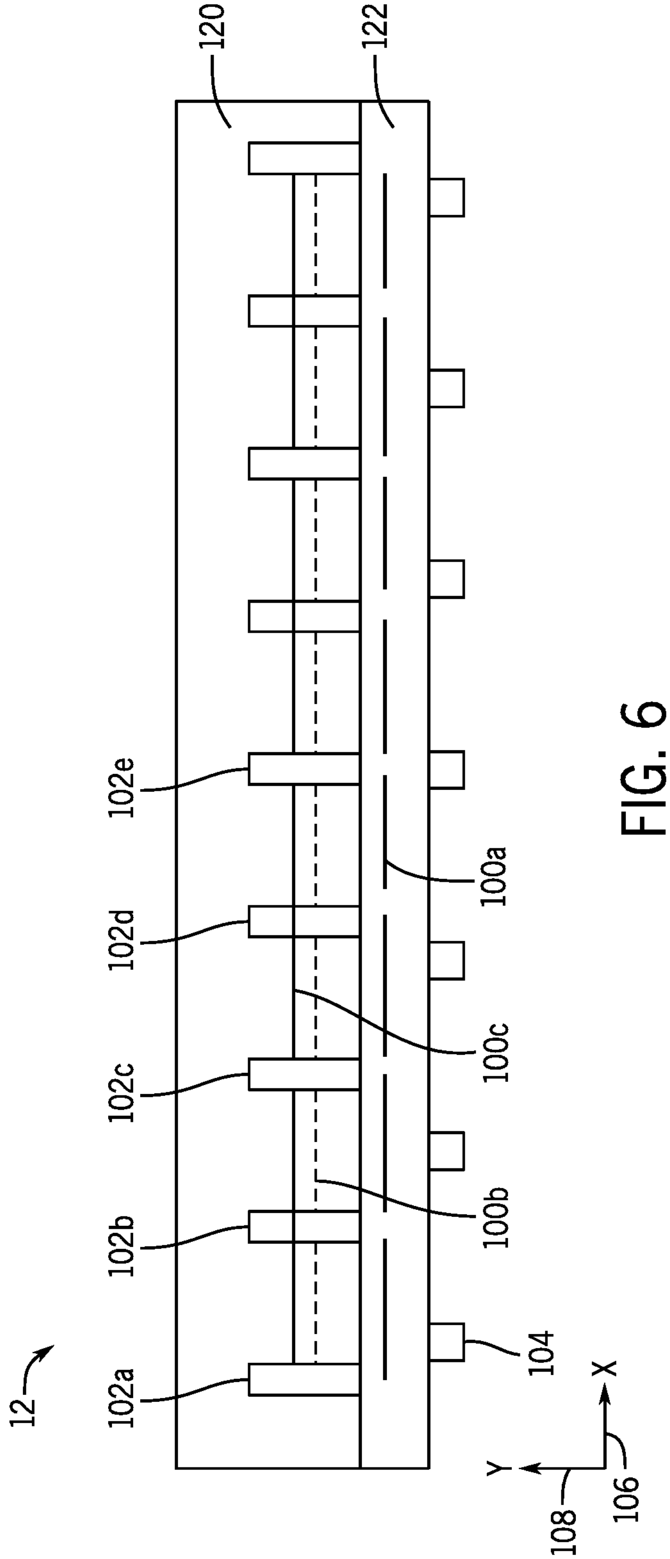
FIG. 6 is a block diagram of the programmable fabric of the integrated circuit device of FIG. 1, in accordance with an embodiment of the present disclosure.

With the foregoing in mind, FIG. 6 is a block diagram of the integrated circuit device 12 formed using backside metallization. In the illustrated example, the front side 120 of FIG. 6 may be the same as the front side 120 of FIG. 5 while the backside 122 of FIG. 6 may be different from the backside 122 of FIG. 5. Indeed, the front side 120 may include the second communication wires 100*b*, the third communication wires 100*c*, and the fabric routing circuitry 102 to transfer signals within the integrated circuit device 12. In this way, the front side 120 may be dedicated for signal transfer and the backside 122 may be utilized to implement one or more functionalities of the integrated circuit device 12. Since the front side 120 may be modular (e.g., identical between different versions), maintaining design and manufacturing techniques for the front side 120 between the different versions of the integrated circuit device 12 may reduce costs and time for manufacturing the integrated circuit device 12. Additionally or alternatively, the front side 120 may be an ASIC, a FPGA, or other programmable logic device to implement a programmable fabric.

Further, to save time and costs, the manufacturer may create one or more versions of the integrated circuit devices 12 having the front side 120 and different designs and/or manufacturing techniques for the backside 122. As illustrated, the backside 122 of FIG. 6 may include the first communication wires 100*a* and the bumps 104. The bumps 104 may include or utilize input/output circuitry 42 and the power delivery network 80 described with respect to FIG. 2. Furthermore, the backside 122 may include the clock resources for implementing one or more functionalities of the integrated circuit device 12. Indeed, the first communication wires 100*a* may propagate the clock signals and/or data signals within the integrated circuit device 12. As illustrated, the backside 122 of FIG. 6 may include communication wires 100*a* that may be shorter (or longer or more/less dense) than the first communication wires 100*a* described with respect to FIG. 5. That is, the wire density in FIG. 6 may be greater than the wire density in FIG. 5. In this way, the integrated circuit device 12 of FIG. 6 may perform differently than the integrated circuit device 12 of FIG. 5. This enables different versions of the integrated circuit device 12 to be customized to planned deployment without changing the metal-dominated front side 120 used for signal routing in the programmable fabric. Indeed, due to the relative simplicity of the backside 122, redesign and change in manufacturing of the backside 122 of the integrated circuit device 12 may be more cost-efficient, less time-consuming, and easier to implement than changing the front side 120.

Figure 7:
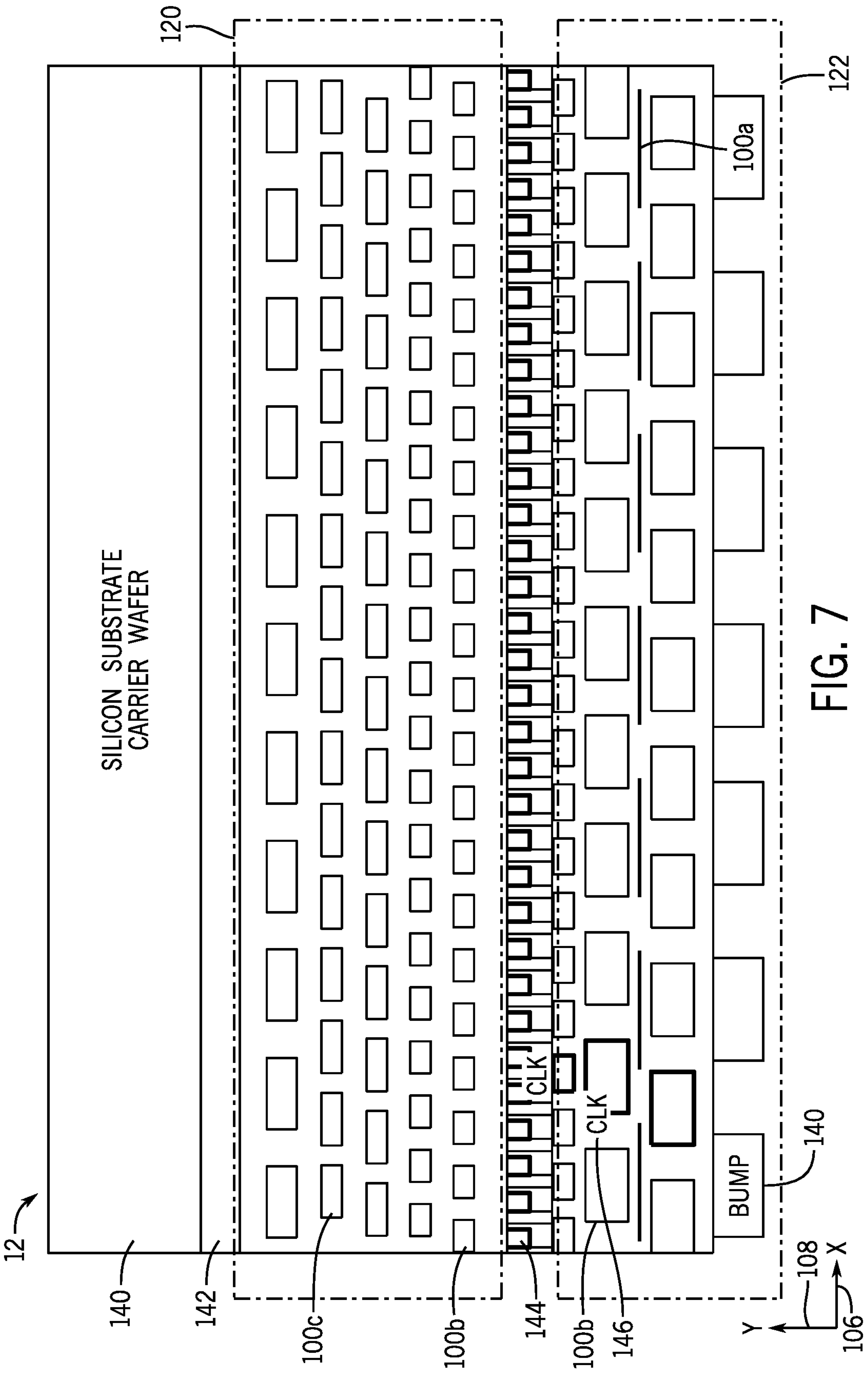
FIG. 7 is a cross-sectional view of the programmable fabric of the integrated circuit device of FIG. 1, in accordance with an embodiment of the present disclosure.

FIG. 7 is a cross-sectional view of an embodiment of the integrated circuit 12 formed using backside metallization. To start the fabrication process, a substrate wafer 140 may be bonded to a device wafer to reduce or eliminate damage during the fabrication process. The device wafer may be patterned with one or more masks and filled with one or more metal layers to form the integrated circuit device 12. In the illustrated example, the substrate 140 is a silicon carrier wafer, however the substrate 140 may be any suitable material for bonding to the device wafer. The substrate 140 and the device wafer may be bonded with an intermediate layer 142. The intermediate layer 142 may include one or more adhesive layers, a release layer, and/or a barrier layer to bond the substrate wafer 140 to the device wafer. For example, the intermediate layer 142 may be an adhesive layer to temporarily bond the device wafer to the substrate 140. The device wafer may be patterned (e.g., etched) by one or more masks to form the integrated circuit 12. The device wafer may be any suitable material, such as silicon (or silicon oxides), silicon carbide, glass, sapphire, or the like.

As described herein, the device wafer may be patterned with a first set of masks and/or a first set of processes to create the front side 120 and a second set of masks and/or a second set of processes to create the backside 122. The first set of masks and/or the first set of processes may be standardized between multiple different integrated circuit devices 12 while the second set of masks and/or the second set of processes may be different to create different versions of the integrated circuit device 12. Modularity of the fabrication process may be increased to reduce manufacturing and design costs. For example, the front side 120 may be patterned to include the second communication wires 100*b*, the third communication wires 100*c*, and the fabric routing circuitry 102. The second communication wires 100*b* and the third communication wires 100*c* may include one or more signal metals with the same densities and layouts for transferring signals within the integrated circuit device 12. Furthermore, as previously discussed, by dedicating the front side 120 for signal transfer, capacitive coupling caused by the power distribution network 80 and/or the clock resources may be reduced or eliminated and signal transmission may be improved.

As previously mentioned, between the front side 120 and the backside 122, the integrated circuit device 12 may include a layer of transistors 144. The transistors 144 may control a state of the integrated circuit device and/or implement one or more functions of the integrated circuit device 12. For example, the transistors 144 may regulate the transfer of signals within the integrated circuit device 12 and generally control operations of the programmable fabric according to a configuration loaded into the programmable fabric. While the transistors 144 are illustrated between the front side 120 and the backside 122, the transistors 144 may also be disposed within the front side 120 and/or the backside 122. In certain instances, the backside 122 may include one or more transistors 144 to control a state of the first communication wires 100*a* for propagating one or more clock signals.

The backside 122 may be formed using backside metallization to route one or more resources within the integrated circuit device 12. The manufacturer may use a second set of masks depending on the functionality of the integrated circuit device 12. For example, to create a high density programmable logic device, such as the FPGA 70, the manufacturer may pattern one or more short fabric routing wires similar to first communication wires 100*a* described with respect to FIG. 6. In another example, the manufacturer may pattern one or more long fabric routing wires similar to the first communication wires 100*a* described with respect to FIG. 5 to create a high performance or application specific integrated circuit device 12. Still in another example, the manufacturer may pattern the backside 122 with a combination of short and long first communication wires 100*a* to implement the functionality of the ingrate circuit device 12. In this way, the manufacturer may make multiple different integrated circuits 12 with different functionalities.

The backside 122 may also include one or more signal metals for signal transfer. For example, the backside 122 may include second communication wires 100*b* and/or third communication wires 100*c* to transfer a signal received from the bumps 140, power delivery resources, and/or the one or more clock resources 146. As described herein, the bumps 140 may transfer signals to and from other devices and/or provide power. When delivering power, power may be directly delivered to the clock resources 146 and improve functionality of the integrated circuit device 12 due to shorter routing. Allocating power to the clock resources 146 on the backside 122 enables the clocking resources 146 to run at different voltages and frequencies. As previously noted, the backside 122 delivering power and clock signals provides more power efficiency and cleaner clocks with less jitter and skew.

Figure 8:
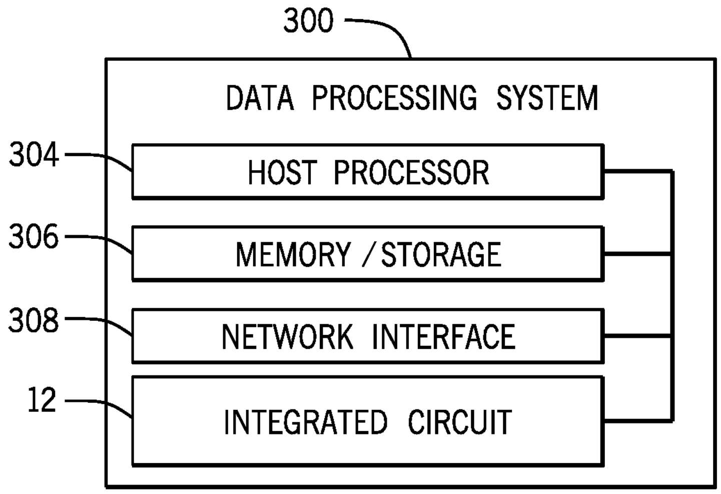
FIG. 8 is a block diagram of a data processing system including the integrated circuit device of FIG. 1, in accordance with an embodiment of the present disclosure.

Bearing the foregoing in mind, the integrated circuit device 12 may be a component included in a data processing system, such as a data processing system 300, shown in FIG. 8. The data processing system 300 may include the integrated circuit device 12 (e.g., a programmable logic device), a host processor 304 (e.g., a processor), memory and/or storage circuitry 306, and a network interface 308. The data processing system 300 may include more or fewer components (e.g., electronic display, user interface structures, application specific integrated circuits (ASICs)). Moreover, any of the circuit components depicted in FIG. 8 may include integrated circuits (e.g., integrated circuit device 12). The host processor 304 may include any of the foregoing processors that may manage a data processing request for the data processing system 300 (e.g., to perform encryption, decryption, machine learning, video processing, voice recognition, image recognition, data compression, database search ranking, bioinformatics, network security pattern identification, spatial navigation, cryptocurrency operations, or the like). The memory and/or storage circuitry 306 may include random access memory (RAM), read-only memory (ROM), one or more hard drives, flash memory, or the like. The memory and/or storage circuitry 306 may hold data to be processed by the data processing system 300. In some cases, the memory and/or storage circuitry 306 may also store configuration programs (bitstreams) for programming the integrated circuit device 12. The network interface 308 may allow the data processing system 300 to communicate with other electronic devices. The data processing system 300 may include several different packages or may be contained within a single package on a single package substrate. For example, components of the data processing system 300 may be located on several different packages at one location (e.g., a data center) or multiple locations. For instance, components of the data processing system 300 may be located in separate geographic locations or areas, such as cities, states, or countries.

In one example, the data processing system 300 may be part of a data center that processes a variety of different requests. For instance, the data processing system 300 may receive a data processing request via the network interface 308 to perform encryption, decryption, machine learning, video processing, voice recognition, image recognition, data compression, database search ranking, bioinformatics, network security pattern identification, spatial navigation, digital signal processing, or some other specialized task.

The above discussion has been provided by way of example. Indeed, the embodiments of this disclosure may be susceptible to a variety of modifications and alternative forms. Indeed, many other suitable forms of high-capacity integrated circuits can be manufactured according to the techniques outlined above. For example, other high-capacity integrated circuit devices may include one or more first communication wires 100*a* within the front side 120 and/or the backside 122. In other embodiments, the backside 122 may include additional component such as fabric routing circuitry, signal metals, or the like. Indeed, any number of integrated circuit devices may be developed using backside metallization to implement one or more functionalities of the integrated circuit device.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

EXAMPLE EMBODIMENTS

EXAMPLE EMBODIMENT 1. A programmable logic device comprising a first set of layers formed using backside metallization on a back plane of the programmable logic device and a second set of layers comprises second fabric routing circuitry to route second data within the programmable fabric. The first set of layers comprises first fabric routing circuitry to route first data within a programmable fabric of the programmable logic device, and clock routing circuitry to route clock signals within the programmable fabric.

EXAMPLE EMBODIMENT 2. The integrated circuit device of example embodiment 1, wherein the first set of layers coupled to one or more bumps.

EXAMPLE EMBODIMENT 3. The integrated circuit device of example embodiment 2, comprising input/output circuitry and power delivery circuitry coupled to the bumps.

EXAMPLE EMBODIMENT 4. The integrated circuit device of example embodiment 1, wherein the second fabric routing circuitry is coupled to the first fabric routing circuitry.

EXAMPLE EMBODIMENT 5. The integrated circuit device of example embodiment 1, wherein the first fabric routing circuitry comprises first communication wires and the second fabric routing circuitry comprises second communication wires, and wherein the first communication wires are longer than the second communication wires.

EXAMPLE EMBODIMENT 6. The integrated circuit device of example embodiment 5, wherein a density of the first communication wires is less than a density of the second communication wires.

EXAMPLE EMBODIMENT 7. The integrated circuit device of example embodiment 1, wherein the first fabric routing circuitry comprises first communication wires and the second fabric routing circuitry comprises second communication wires, and wherein the first communication wires have a same length as the second communication wires.

EXAMPLE EMBODIMENT 8. The integrated circuit device of example embodiment 1, comprising a plurality of transistors disposed between the first set of layers and the second set of layers.

EXAMPLE EMBODIMENT 9. The integrated circuit device of example embodiment 1, comprising a plurality of transistors of disposed within the first set of layers.

EXAMPLE EMBODIMENT 10. The integrated circuit device of example embodiment 1, wherein an operating voltage of the clocking routing circuitry is different than an operating voltage of the second fabric routing circuitry.

EXAMPLE EMBODIMENT 11. The integrated circuit device of example embodiment 1, wherein the second set of layers comprises power delivery circuitry to deliver power within the programmable fabric.

EXAMPLE EMBODIMENT 12. A programmable logic device comprising a first set of layers formed using backside metallization on a back plane of the programmable logic device and a second set of layers of the programmable logic device, wherein the second set of layers comprises fabric routing circuitry to route data within the programmable fabric. The first set of layers comprises: clock routing circuitry to route clock signals within a programmable fabric of the programmable logic device and power delivery circuitry to deliver power within the programmable fabric; and EXAMPLE EMBODIMENT 13. The integrated circuit device of example embodiment 12, wherein the first set of layers are coupled to a plurality of input/output bumps and a plurality of power delivery bumps.

EXAMPLE EMBODIMENT 14. The integrated circuit device of example embodiment 13, wherein the power delivery bumps are coupled to the power delivery circuitry, wherein the power delivery circuitry delivers power within the programmable fabric through the first set of layers.

EXAMPLE EMBODIMENT 15. The integrated circuit device of example embodiment 13, comprising second fabric routing circuitry within the first set of layers coupled to the input/output bumps and to route second data within the programmable fabric.

EXAMPLE EMBODIMENT 16. The integrated circuit device of example embodiment 15, wherein a length of a segment in the second fabric routing circuitry is different than a length of a segment in the fabric routing circuitry.

EXAMPLE EMBODIMENT 17. A programmable logic device comprising a first set of layers on a first side of a die comprising first fabric routing circuitry to route first data within a programmable fabric and a second set of layers on a second side of the die that is opposite of the first side. The second set of layers is coupled to a plurality of bumps and comprising second fabric routing circuitry to route second data within the programmable fabric, power delivery circuitry to route power within the programmable fabric, and clock routing circuitry to route clock signals within the programmable fabric, and a plurality of transistors between the first set of layers and the second set of layers to at least partially implement a programmable fabric.

EXAMPLE EMBODIMENT 18. The programmable logic device of example embodiment 17, comprising input/output circuitry coupled to a set of the plurality of bumps to transfer the second data to and from a device coupled to the programmable logic device.

EXAMPLE EMBODIMENT 19. The programmable logic device of example embodiment 17, wherein routing of the first data, the second data, power, and clock signals in the programmable logic device are programmed using design software based on timing, wire usage, logic utilization in the programmable fabric, and/or a routability.

EXAMPLE EMBODIMENT 20. The programmable logic device of example embodiment 17, wherein an operational voltage of the clock routing circuitry is different than an operational voltage of the programmable fabric.

What is claimed is:

1. A programmable logic device comprising:

a first set of layers on a first side of a die formed using backside metallization on a back plane of the programmable logic device, wherein the first set of layers is coupled to one or more bumps and comprises:

first fabric routing circuitry to route first data within a programmable fabric of the programmable logic device; and clock routing circuitry to route clock signals within the programmable fabric; and a second set of layers on a second side of the die that is opposite of the first side comprises second fabric routing circuitry to route second data within the programmable fabric, wherein the first set of layers are configured to route at least a portion of the first data between the second fabric routing circuitry and at least one bump of the one or more bumps, wherein the first fabric routing circuitry comprises programmable interconnects.

2. The programmable logic device of claim 1, comprising input/output circuitry and power delivery circuitry coupled to the bumps.

3. The programmable logic device of claim 1, wherein the second fabric routing circuitry is coupled to the first fabric routing circuitry.

4. The programmable logic device of claim 1, wherein the first fabric routing circuitry comprises first communication wires and the second fabric routing circuitry comprises second communication wires, and wherein the first communication wires are longer than the second communication wires.

5. The programmable logic device of claim 1, comprising a plurality of transistors disposed between the first set of layers and the second set of layers.

6. The programmable logic device of claim 1, comprising a plurality of transistors of disposed within the first set of layers.

7. The programmable logic device of claim 1, wherein an operating voltage of the clock routing circuitry is different than an operating voltage of the second fabric routing circuitry.

8. The programmable logic device of claim 1, wherein the second set of layers comprises power delivery circuitry to deliver power within the programmable fabric.

9. The programmable logic device of claim 1, wherein the first set of layers and the second set of layers are formed on opposite surfaces of a substrate of the die, and wherein the one or more bumps are coupled only to the first set of layers.

10. The programmable logic device of claim 1, wherein the programmable fabric comprises programmable logic elements comprising look-up tables.

11. The programmable logic device of claim 1, wherein the programmable fabric comprises configuration memory to control a state of the first fabric routing circuitry.

12. A programmable logic device comprising:

a first set of layers on a first side of a die formed using backside metallization on a back plane of the programmable logic device, wherein the first set of layers is coupled to a plurality of bumps and comprises:

clock routing circuitry to route clock signals within a programmable fabric of the programmable logic device; and power delivery circuitry to deliver power within the programmable fabric; and a second set of layers on a second side of the die that is opposite of the first side of the programmable logic device, wherein the second set of layers comprises fabric routing circuitry to route data within the programmable fabric, wherein the first set of layers are configured to route at least a portion of the clock signals between the fabric routing circuitry and a subset of the plurality of bumps, wherein the fabric routing circuitry comprises programmable interconnects.

13. The programmable logic device of claim 12, wherein the plurality of bumps comprise a plurality of input/output bumps and a plurality of power delivery bumps.

14. The programmable logic device of claim 13, wherein the power delivery bumps are coupled to the power delivery circuitry, wherein the power delivery circuitry delivers power within the programmable fabric through the first set of layers.

15. The programmable logic device of claim 13, comprising second fabric routing circuitry within the first set of layers coupled to the input/output bumps and to route second data within the programmable fabric.

16. The programmable logic device of claim 15, wherein a length of a segment in the second fabric routing circuitry is different than a length of a segment in the fabric routing circuitry.

17. A programmable logic device comprising:

a first set of layers on a first side of a die comprising first fabric routing circuitry to route first data within a programmable fabric;

a second set of layers on a second side of the die that is opposite of the first side, wherein the second set of layers is coupled to a plurality of bumps and comprising:

second fabric routing circuitry to route second data within the programmable fabric, wherein the second set of layers are configured to route at least a portion of the second data between the first fabric routing circuitry and a subset of the plurality of bumps, wherein the first fabric routing circuitry comprises programmable interconnects;

power delivery circuitry to route power within the programmable fabric; and clock routing circuitry to route clock signals within the programmable fabric; and a plurality of transistors between the first set of layers and the second set of layers to at least partially implement a programmable fabric.

18. The programmable logic device of claim 17, comprising input/output circuitry coupled to a set of the plurality of bumps to transfer the second data to and from a device coupled to the programmable logic device.

19. The programmable logic device of claim 17, wherein routing of the first data, the second data, power, and clock signals in the programmable logic device are programmed using design software based on timing, wire usage, logic utilization in the programmable fabric, and/or a routability.

20. The programmable logic device of claim 17, wherein an operational voltage of the clock routing circuitry is different than an operational voltage of the programmable fabric.

* * * * *